United States Patent [19]

Jordan et al.

[11] 4,095,006

[45] June 13, 1978

[54] CADMIUM SULFIDE FILM

[75] Inventors: John Francis Jordan; Curtis Magill Lampkin, both of El Paso, Tex.

[73] Assignee: Photon Power, Inc., El Paso, Tex.

[21] Appl. No.: 670,625

[22] Filed: Mar. 26, 1976

[51] Int. Cl.$^2$ ............................................. H01C 31/00
[52] U.S. Cl. ..................................... 427/427; 427/74; 427/314; 252/501
[58] Field of Search .................... 252/501; 423/561 B; 106/301

[56] References Cited

U.S. PATENT DOCUMENTS

| | | | |
|---|---|---|---|
| 2,980,500 | 4/1961 | Miller | 423/561 B X |
| 3,592,643 | 7/1971 | Bartfai | 106/301 X |
| 3,852,404 | 12/1974 | Daly | 106/301 X |
| 3,880,633 | 4/1975 | Jordan et al. | 65/65 A X |

OTHER PUBLICATIONS

Chemical Abstracts 81, 70432p, "Use of Thiourea During the Synthesis of Cadmium Sulfide".
Chemical Abstracts 78, 90623t, "Thiourea Method of Preparing Cadmium Sulfide for Luminophors".

*Primary Examiner*—Richard E. Schafer
*Assistant Examiner*—E. Suzanne Parr
*Attorney, Agent, or Firm*—Bard, Springs, Jackson & Groves

[57] ABSTRACT

A method of forming a cadmium sulfide film from a solution containing a cadmium salt and a sulfur containing compound comprising inclusion of a chlorine containing compound in the solution utilized to form the cadmium sulfide film.

14 Claims, No Drawings

CADMIUM SULFIDE FILM

BACKGROUND OF THE INVENTION

1. Field of the Invention

The present invention relates to a method of forming polycrystalline films, and more particularly to formation of polycrystalline films comprised essentially of cadmium sulfide.

2. Description of the Prior Art

Crystalline films of cadmium sulfide are useful in the formation of photovoltaic cells, among other uses. Prior art methods of forming polycrystalline films of cadmium sulfide typically utilize cadmium chloride as the cadmium salt constituent of the crystal forming solution. For example, in Jordan, et al., U.S. Pat. No. 3,880,633, a spray method for forming a cadmium sulfide photovoltaic cell is disclosed, utilizing a solution comprising cadmium chloride and thiourea.

Although it can be beneficial to utilize cadmium salts other than cadmium chloride in the formation of cadmium sulfide films, such as cadmium iodide, cadmium bromide, cadmium acetate, cadmium nitrate, etc., the prior art fails to teach a method whereby a uniform, continuous cadmium sulfide film can be formed utilizing such cadmium salts.

The present invention overcomes this difficulty. The method of the present invention teaches inclusion of a chlorine containing compound in the solution utilized to form the cadmium sulfide film to catalyze the film forming reaction. This method allows use of cadmium salts other than cadmium chloride.

SUMMARY OF THE INVENTION

A method of forming a film comprising essentially cadmium sulfide from a solution containing a cadmium salt and a sulfur containing compound in accordance with the present invention comprises inclusion in the film forming solution of a chlorine containing compound to catalyze the reaction between the cadmium salt and the sulfur containing compound.

Additional compounds may be included in the solution, which may further facilitate the formation and affect the characteristics of the cadmium sulfide film.

Thus, it is the primary object of the present invention to provide a method for formation of cadmium sulfide films from solutions containing cadmium salts heretofore not capable of forming uniform, continuous cadmium sulfide films.

Another object of the present invention is to provide a method for forming cadmium sulfide films having some characteristics different from cadmium sulfide films heretofore known.

Yet a further object of the present invention is to provide novel solutions for forming cadmium sulfide films.

These and other objects, advantages, and features of the subject invention will hereinafter appear, and for the purposes of illustration, but not of limitation, exemplary embodiments of the present invention are described in the following detailed description.

DETAILED DESCRIPTION

We have found that by including a chlorine containing compound in a solution or composition utilized to form a polycrystalline film comprised essentially of cadmium sulfide, film growth is facilitated and film quality improved. Moreover, such a chlorine compound is believed to catalyze the reaction between the cadmium salt and sulfur containing compound so as to allow use of cadmium salts heretofore thought incapable of forming a uniform, continuous cadmium sulfide film. Examples of these other cadmium salts are cadmium iodide, cadmium bromide, cadmium acetate, and cadmium nitrate.

Although we believe that most chlorine containing compounds may be utilized to catalyze the reaction, especially those which disassociate freely in solution, we have found that hydrochloric acid and ammonium chloride provide the best results. By way of example, and not of limitation, the following exemplary solutions have been found to successfully form uniform, continuous cadmium sulfide films when utilized in a spray process, such as described in U.S. Pat. No. 3,880,633, the disclosure of which is incorporated herein by reference.

EXAMPLE 1

A solution comprising:

22.08 gm — Cadmium Acetate [$Cd(CH_3COO)_2 \cdot 2H_2O$]
6.58 gm — Thiourea
8.24 gm — Ammonium Chloride [$NH_4Cl$]
6.0 l — Water will form a uniform, continuous cadmium sulfide film. However, a solution having the same constituents in the same proportions, but without ammonium chloride, will not form such a film.

EXAMPLE 1-A 16.30 gm — Cadmium Acetate [$Cd(CH_3COO)_2 \cdot 2H_2O$]
6.58 gm — Thiourea
8.24 gm — Ammonium chloride [$NH_4Cl$]
6.58 gm — Aluminum chloride [$AlCl_3 \cdot 6H_2O$]
6.0 l — Water This solution is essentially the same as the Example 1 solution, with the addition of aluminum chloride. The aluminum chloride is added to alter the physical properties of the cadmium sulfide film, in the manner and for the reasons disclosed in U.S. application Ser. No. 631,815.

EXAMPLE 1-B 29.45 gm — Cadmium Acetate [$Cd(CH_3COO)_2 \cdot 2H_2O$]
6.94 gm — Thiourea
14.0 ml — HCl (concentrated)
6.0 l — Water This solution, which is also essentially identical to the Example 1 solution, utilizes hydrochloric acid as the catalyzing chlorine containing compound, instead of ammonium chloride.

EXAMPLE 2

30.36 gm — Cadmium Iodide [$CdI_2$]
6.58 gm — Thiourea
14.0 ml — HCl (concentrated)
6.0 l — Water

EXAMPLE 2-A 30.36 gm — Cadmium Iodide [$CdI_2$]
6.58 gm — Thiourea
8.24 gm — Ammonium Chloride [$NH_4Cl$]
6.0 l — Water

EXAMPLE 3

21.2 gm — Cadmium Sulfate [$3CdSO_4.8H_2O$]
6.58 gm — Thiourea
14.0 ml — HCl (concentrated)
6.0 l — Water

EXAMPLE 3-A 21.2 gm — Cadmium Sulfate [$3CdSO_4.8H_2O$]
6.58 gm — Thiourea
8.24 gm — Ammonium Chloride [$NH_4Cl$]
6.0 l — Water

EXAMPLE 4

25.57 gm — Cadmium Nitrate [$Cd(NO_3)_2.4H_2O$]
6.58 gm — Thiourea
14.0 ml —HCl (concentrated)
6.0 l — Water

EXAMPLE 5

37.24 gm — Cadmium Bromide [$CdBr_2.4H_2O$]
10.96 gm — Thiourea
14.0 ml — HCl (concentrated)
6.0 l — Water In addition to the cadmium compounds included in the above exemplary formulae, we have found that continuous sulfide films can be fabricated according to the present invention with other cadmium compounds, including cadmium fluoride, cadmium cyanide and cadmium sulfite. Moreover, cadmium compounds which also contain chlorine, such as cadmium ammonium chloride, can be utilized in the method of the present invention to supply both cadmium and chlorine.

Although each of the exemplary solutions utilize thiourea as the sulfur containing compound, other sulfur containing compounds may be utilized. We have found thiourea, however, to be the least expensive and best suited of such compounds for purposes of solutions such as these. Similarly, hydrochloric acid and ammonium chloride are merely exemplary chlorine containing compounds, and other chlorine containing compounds may be substituted.

Furthermore, although each of the above-identified exemplary solutions was developed for use in a spray process for forming a cadmium sulfide film, other well known processes for forming such films, such as dipping, vacuum deposition, or electroplating, may also be utilized.

It should be understood that various changes, modifications, and variations to the solutions utilized in the method of the present invention may be effected without departing from the spirit and scope of the present invention as defined in the appended claims.

We claim:

1. The method of forming a film including cadmium sulfide crystals, comprising the step of spraying a solution comprising a water soluble cadmium salt other than cadmium chloride, a water soluble organic sulfur containing compound capable of reacting with a cadmium salt in the presence of chloride ions to form cadmium sulfide crystals, and a water soluble chlorine containing compound, other than cadmium chloride, which freely disassociates chloride ions in aqueous solution to catalyze a reaction involving said cadmium salt and said sulfur containing compound to form a film of said cadmium sulfide crystals on a heated substrate.

2. The method according to claim 1, wherein cadmium salt is selected from the group consisting of cadmium iodide, cadmium bromide, cadmium acetate, cadmium ammonium chloride, cadmium nitrate, and cadmium sulfate.

3. The method according to claim 2, wherein the sulfur containing compound is thiourea.

4. The method according to claim 3, wherein the chlorine containing compound is selected from the group consisting of hydrochloric acid, ammonium chloride, and cadmium ammonium chloride.

5. A method of forming a film including cadmium sulfide crystals, comprising the step of spraying a composition comprising a cadmium salt selected from the group consisting of cadmium iodide, cadmium bromide, cadmium acetate, cadmium nitrate, cadmium sulfate, and cadmium ammonium chloride;
   thiourea; and
   a chlorine containing compound selected from the group consisting of hydrochloric acid, ammonium chloride, and cadmium ammonium chloride;
   in forming a film comprising cadmium sulfide on a heated substrate.

6. A method of forming a film comprising cadmium sulfide crystals from a sprayed composition of a cadmium salt other than cadmium chloride and a sulfur containing compound, wherein the improvement comprises the step of including in the composition a chlorine containing compound, other than cadmium chloride, which freely disassociates chloride ions in aqueous solution to catalyze a reaction involving said cadmium salt and said sulfur compound to form a film of said cadmium sulfide crystals on a heated substrate.

7. The method according to claim 6, wherein the chlorine containing compound is selected from the group consisting of hydrochloric acid, ammonium chloride, and cadmium ammonium chloride.

8. A film of cadmium sulfide crystals formed by use of a composition comprising a water soluble cadmium salt other than cadmium chloride, a water soluble, organic sulfur containing compound capable of reacting with a cadmium salt in the presence of chloride ions to form cadmium sulfide crystals, and a water soluble chlorine containing compound, other than cadmium chloride, which freely disassociates chloride ions in aqueous solution to catalyze a reaction involving said cadmium salt and said sulfur compound when said composition is sprayed onto a heated substrate.

9. A film as in claim 8, wherein the cadmium salt is selected from the group consisting of cadmium iodide, cadmium bromide, cadmium acetate, cadmium nitrate, cadmium sulfate, and cadmium ammonium chloride.

10. A composition for forming a film comprised of cadmium sulfide crystals comprising a water soluble cadmium salt other than cadmium chloride, a water soluble, organic sulfur containing compound capable of reacting with a cadmium salt in the presence of chloride ions to form cadmium sulfide crystals, and a water soluble chlorine containing compound, other than cadmium chloride, which freely disassociates chloride ions in aqueous solution to catalyze a reaction involving said cadmium salt and said sulfur compound when said composition is sprayed onto a heated substrate.

11. The composition claimed in claim 10, wherein the cadmium salt is selected from the group consisting of cadmium iodide, cadmium bromide, cadmium acetate, cadmium nitrate, cadmium sulfate, and cadmium ammonium chloride.

12. The composition claimed in claim 11, wherein the sulfur containing compound is thiourea.

13. The composition claimed in claim 12, wherein the chlorine containing compound is selected from the group consisting of hydrochloric acid, ammonium chloride, and cadmium ammonium chloride.

14. A film comprised of cadmium sulfide formed by use of a composition comprising:

a cadmium salt selected from the group consisting of cadmium iodide, cadmium bromide, cadmium acetate, cadmium nitrate, cadmium sulfate, and cadmium ammonium chloride;

thiourea; and a chlorine containing compound selected from the group consisting of hydrochloric acid, ammonium chloride, and cadmium ammonium chloride.

* * * * *